United States Patent [19]

Imanaka et al.

[11] Patent Number: 6,074,041
[45] Date of Patent: Jun. 13, 2000

[54] INK JET RECORDING HEAD HAVING AN ELECTRIC DISCHARGE PATH FOR RELEASING STATIC ELECTRICITY AND RECORDING APPARATUS USING SAME

[75] Inventors: Yoshiyuki Imanaka, Yokohama; Tsutomu Abe, Isehara; Ryoichi Koizumi, Yokohama, all of Japan

[73] Assignee: Canon Kabushiki Kaisha, Tokyo, Japan

[21] Appl. No.: 08/294,911

[22] Filed: Aug. 24, 1994

[30] Foreign Application Priority Data

Aug. 26, 1993 [JP] Japan .................................. 5-211547
Nov. 29, 1993 [JP] Japan .................................. 5-297123

[51] Int. Cl.[7] .................................. B41J 2/14; B41J 2/16
[52] U.S. Cl. .................................................. 347/50
[58] Field of Search .................................. 347/18, 49, 50, 347/44; 307/89, 91; 361/212, 220, 729, 799, 800; 174/51; 220/402; 206/709, 719, 721; 171/35 R; 400/124.11

[56] References Cited

U.S. PATENT DOCUMENTS

| | | | |
|---|---|---|---|
| 4,313,124 | 1/1982 | Hara | 347/57 |
| 4,345,262 | 8/1982 | Shirato et al. | 347/10 |
| 4,459,600 | 7/1984 | Sato et al. | 347/47 |
| 4,463,359 | 7/1984 | Ayata et al. | 347/56 |
| 4,558,333 | 12/1985 | Sugitani et al. | 347/65 |
| 4,608,577 | 8/1986 | Hori | 347/66 |
| 4,707,157 | 11/1987 | Hauslaib | 400/616 |
| 4,723,129 | 2/1988 | Endo et al. | 347/56 |
| 4,740,796 | 4/1988 | Endo et al. | 347/56 |
| 4,898,487 | 2/1990 | Brull et al. | 400/354 |
| 5,055,859 | 10/1991 | Wakabayashi et al. | 347/209 |
| 5,095,321 | 3/1992 | Saito et al. | 347/63 |
| 5,175,565 | 12/1992 | Ishinaga et al. | 347/67 |
| 5,212,503 | 5/1993 | Saito et al. | 347/59 |
| 5,357,268 | 10/1994 | Kishida et al. | 347/13 |
| 5,357,397 | 10/1994 | Leary | 361/220 |
| 5,428,498 | 6/1995 | Hawkins et al. | 347/50 |
| 5,500,556 | 3/1996 | Kosugi | 257/718 |

FOREIGN PATENT DOCUMENTS

| | | | |
|---|---|---|---|
| 54-56847 | 5/1979 | Japan . | |
| 59-123670 | 7/1984 | Japan . | |
| 59-138461 | 8/1984 | Japan . | |
| 60-71260 | 4/1985 | Japan . | |
| 61-158489 | 7/1986 | Japan . | |
| 0029554 | 10/1986 | Japan | 347/203 |
| 1-69374 | 3/1989 | Japan . | |
| 1-198375 | 8/1989 | Japan . | |
| 2-204766 | 8/1989 | Japan . | |
| 4247947 | 3/1992 | Japan . | |
| 5-201000 | 8/1993 | Japan . | |
| 256982 | 9/1995 | Taiwan | 257/718 |
| 2114954 | 9/1983 | United Kingdom . | |

OTHER PUBLICATIONS

"High Voltage Engineering", cover and pp. 10–22 through 10–25 (Aug. 25, 1989), with partial translation handwritten thereon.

*Primary Examiner*—N. Le
*Assistant Examiner*—L. Anderson
*Attorney, Agent, or Firm*—Fitzpatrick, Cella, Harper & Scinto

[57] ABSTRACT

An ink jet recording head detachably mountable to a main assembly of a recording apparatus includes ejection energy generating elements for generating energy for ejecting ink; wiring for supplying electric signals to the ejection energy generating elements; electric contacts, connected with the wiring, for receiving the electric signals; and an electric discharge path, provided at least a part of a periphery of the electric contacts, for releasing static electricity.

8 Claims, 10 Drawing Sheets

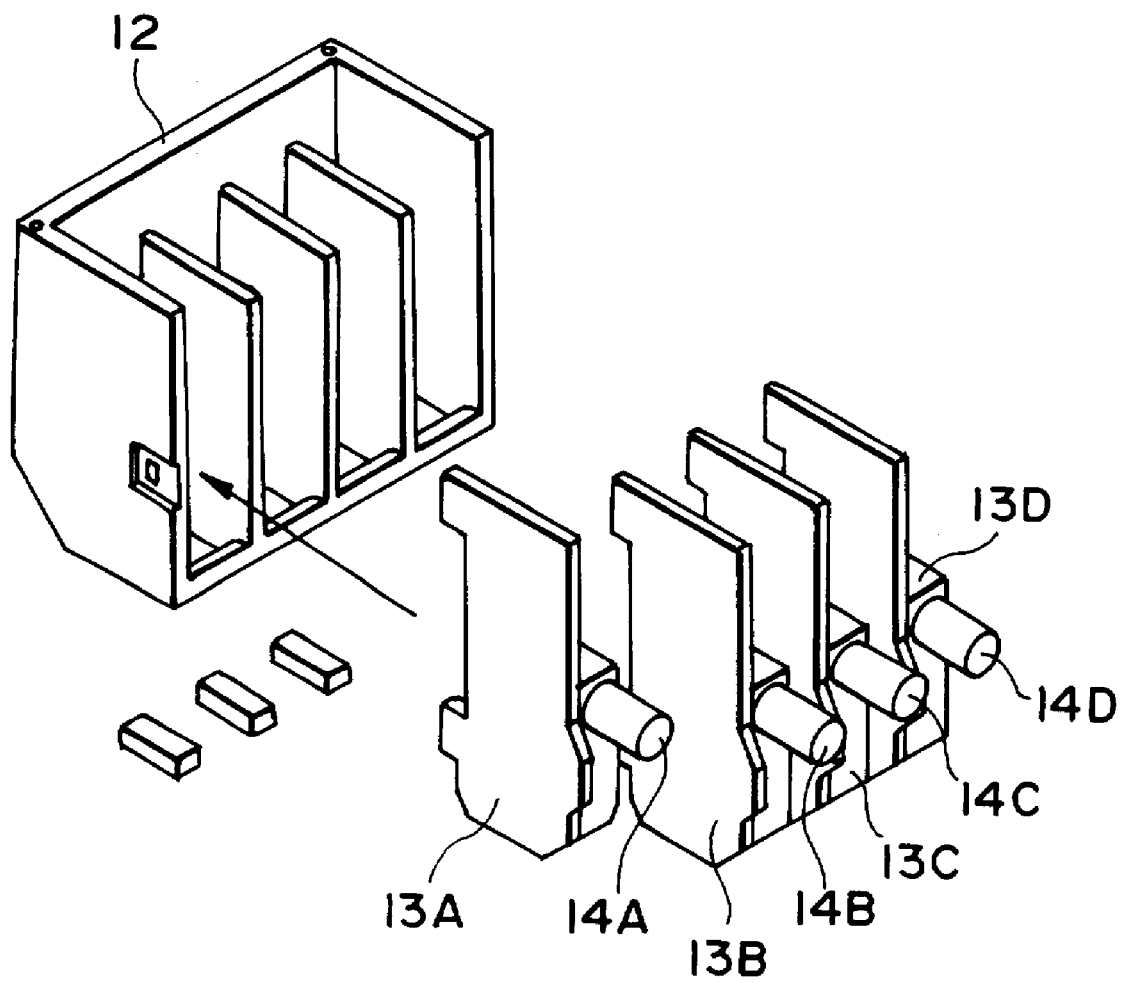
F I G. 5

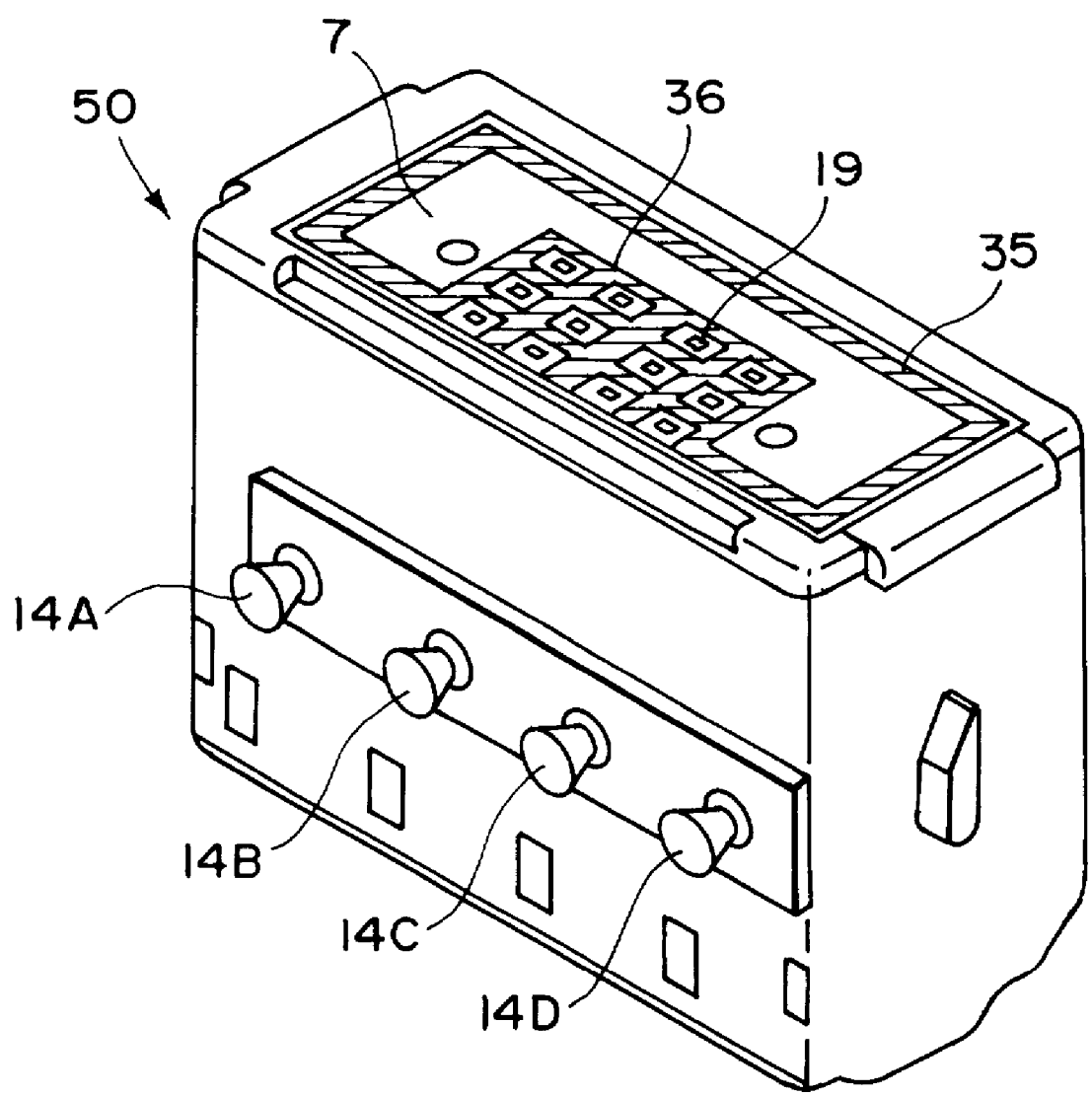
F I G. 10

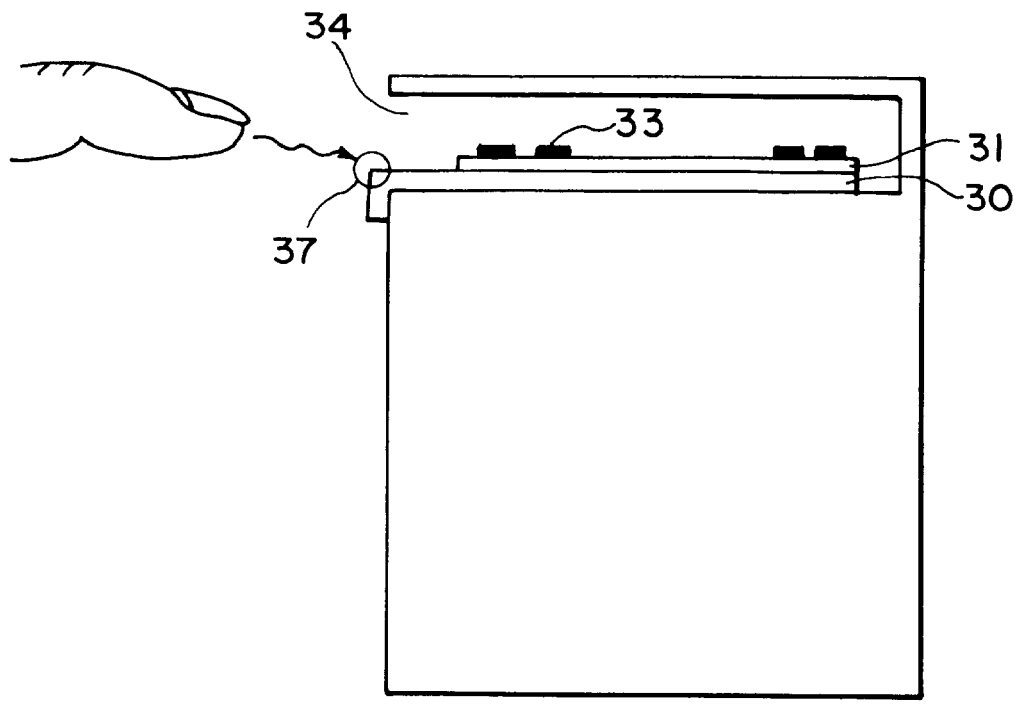
F I G. 11
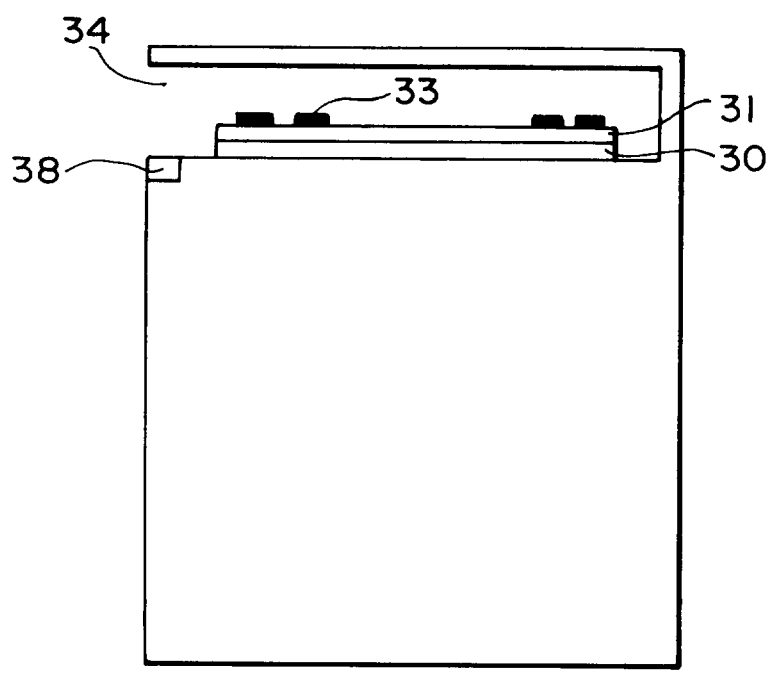
F I G. 12

INK JET RECORDING HEAD HAVING AN ELECTRIC DISCHARGE PATH FOR RELEASING STATIC ELECTRICITY AND RECORDING APPARATUS USING SAME

FIELD OF THE INVENTION AND RELATED ART

The present invention relates to an ink jet recording head and a recording apparatus using the same, in which the recording is effected by ejecting ink. Here, "recording" means formation, on a recording material, of any image such as a character or characters having particular meaning or of any pattern or the like having or not having any particular meaning; and "recording material" means not only paper, but also OHP sheet, color filter substrate, electric circuit substrate, textile, string or the like.

In an ink jet recording method, droplets of recording material called "ink" are ejected through one of various methods onto a recording material such as a sheet of the paper. As for a method for ejecting the ink, there are various methods, and among them, a type in which heat is applied to liquid to produce the force for ejecting the ink, is particularly noted.

More particularly, the liquid is subjected to change of state by the application of the heat, and the volume of the liquid is abruptly increased. By the force produced thereby, the liquid is ejected through an ejection outlet at an end of a recording head. The ejected liquid is deposited on the recording material.

The ink jet recording system is very effectively used in a so-called "drop-on demand recording method". In addition, a high density multi-nozzle recording head can be easily manufactured, and therefore, a high resolution and high quality images can be printed at high speed.

The recording head used in this method is provided with ejection outlets for ejecting the liquid, a liquid ejection portion having an ink passage with a heat application portion where the thermal energy for ejecting the droplet of the liquid is applied to the liquid, and energy generating elements for producing thermal energy.

The energy generating element comprises a pair of electrodes, and a heat generating resistor connected between them and effective to produce thermal energy.

A plurality of heat generating resistors are provided on a heater board (element substrate) 1 of Si. The heater board comprises built-in heat generating resistors 2 at least. However, driving element for the heat generating resistors, temperature detecting element or subordinate heater, may be simultaneously built-in, as the case may be.

Referring to FIG. 1, which is a top plan view of the heater board 1 having the energy generating elements or the like, the heater board also comprises a temperature sensor 6 for detecting a temperature of the recording head (ink), a subordinate heater 107 for heating the recording head (ink) to control the temperature, and wire bonding pads 10, and the like. Since the substrate 1 is directly contacted to the ink, a tantalum (Ta) film 20 is formed on the top of the substrate as a protection layer against the ink and cavitation. The Ta layer 20 covers the entire area of the substrate above a line 20b in FIG. 1, that is, all the area except the bonding pad area which is to be electrically connected externally. Since the ink exists in ink passages and common ink chamber constituted by the board 1 and a top plate, and therefore, the ink is contacted to the board 1 in the area defined by the line 21B. In FIG. 2, a temperature sensor 6 is provided outside the liquid chamber line 21B.

In FIG. 2, there is shown the board 1 of FIG. 2 disposed on an aluminum base plate (support) 30, and a PCB 31 is also disposed on the aluminum base plate 30. On the PCB 31, there are provided pads for external electric connection and wiring for connecting the substrate 20 and the pads 33. The board 1 and the PCB 31 are electrically connected through wire bonding (not shown).

FIG. 4 illustrates a recording head containing the assembly shown in FIG. 3. In this example, the recording head is provided with an opening 34, in which the aluminum base plate having the PCB 31, as shown in FIG. 3, is disposed. When the recording head is mounted on a carriage of a main assembly of the printer, the pads 33 on the PCB 31, are electrically connected with contacts outside the recording head.

As described in the foregoing, the ink jet recording head includes therein a heater board which is a semiconductor element. Similarly to usual IC, the heater board is not highly durable against static electricity. When the electric discharge occurs in the ink jet recording head, the heater board may be broken with the result of inoperativity of the ink jet recording head, due to dielectric break down caused by instantaneously high voltage application or due to fusing of wiring caused by instantaneous large electric current. If the electric discharge is not confined in the ink jet recording head but it also occurs in the main assembly in the recording apparatus, the instantaneous current is extremely large. If the current flows through the heater board, the possibility of the breakage is increased.

Particularly, in a detachably mountable recording head which is recently used widely, the possibility that the user's fingers are contacted to the recording head. In view of this, in the conventional ink jet recording head, as shown in FIG. 3, the main body 50 of the recording head is provided with a plate 51 for covering the electric connection pads 33 of the recording head. The protection plate 51 covers the print board (PWB) provided with contact pads 33 and electric wiring connected to the unshown heater board adjacent the ink ejection outlets 52. Thus, the protection plate 51 functions to prevent electric discharge to the main body 50 of the recording head, for the recording head itself or for the recording head mounted on the recording apparatus. Thus, the heater board is prevented from being destroyed.

However, the protection plate 51 is a factor against cost reduction and downsizing of the ink jet recording head.

Additionally, even if the protection plate 51 is provided, there is a liability that the user's finger might contact an end of the PCB through an opening 34, or that the electric discharge occurs by the approach of the finger. Particularly, the recent heater board has built-in shift resistors and power transistors or the like for driving the heat generating resistors. This further enhances the necessity for the measurement against the static electricity.

SUMMARY OF THE INVENTION

Accordingly, it is a principal object of the present invention to provide a ink jet recording head and an ink jet recording apparatus using the same in which a damage attributable to the static electricity is prevented with simple means at low cost.

According to an aspect of the present invention, there is provided an ink jet recording head detachably mountable to a main assembly of a recording apparatus, comprising: ejection energy generating elements for generating energy for ejecting ink; wiring for supplying electric signals to the ejection energy generating elements; electric contacts, connected with the wiring, for receiving the electric signals; and an electric discharge path, provided at least a part of a periphery of the electric contacts, for releasing static electricity.

According to another aspect of the present invention, there is provided an ink jet recording head detachably mountable to a main assembly of a recording apparatus, comprising: an element board having ejection energy generating elements for generating energy for ink ejection, and wiring for supplying electric signals to the ejection energy generating elements; a wiring board having electric contacts for receiving the electric signals and wiring for electrically connecting the electric contacts and the element board; a metal support for supporting the element board and the wiring board; wherein the electric contacts are disposed in a space continuing to an opening; and a discharge path, provided at an edge of the opening, for releasing static electricity.

Thus, if the external discharge occurs, for example, it is received by a discharge path so that the electric charge produced thereby is re-discharged toward the main assembly of the recording apparatus through the discharge path, and therefore, the electric current does not flow through the recording head even if the discharge or the re-discharge occurs. Therefore, the function of the recording head is protected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is an exploded perspective view of the ink jet recording head of FIG. 4.

FIG. 10 is a perspective view of an ink jet head according to another embodiment of the present invention.

FIG. 11 is a sectional view of an ink jet recording head according to a further embodiment of the present invention.

FIG. 12 is a sectional view of an ink jet recording head according to a further embodiment of the present invention.

DESCRIPTION OF THE PREFERRED EMBODIMENTS

Figure 4:
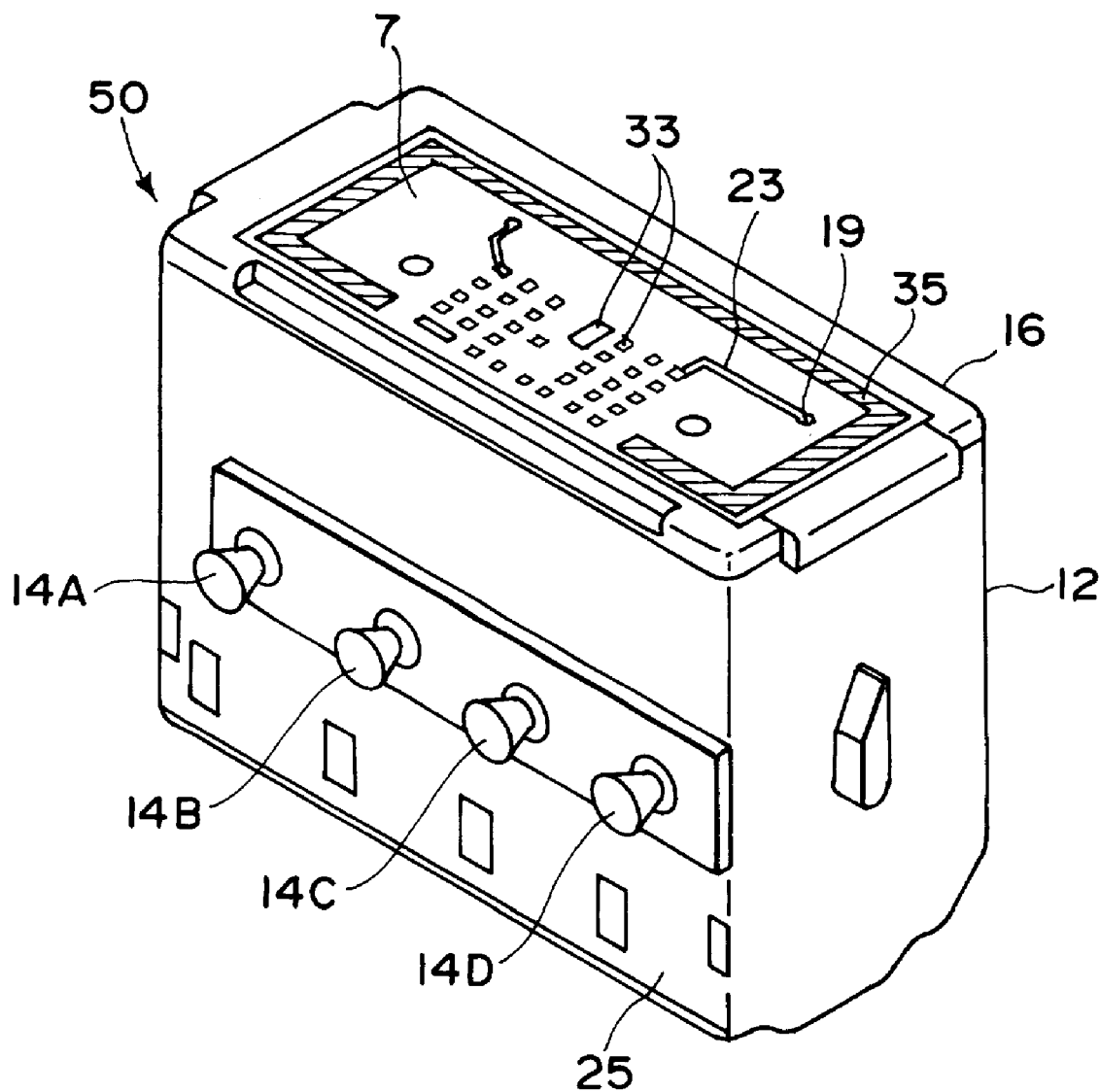
FIG. 4 is a perspective view of an ink jet head according to an embodiment of the present invention.
Figure 6:
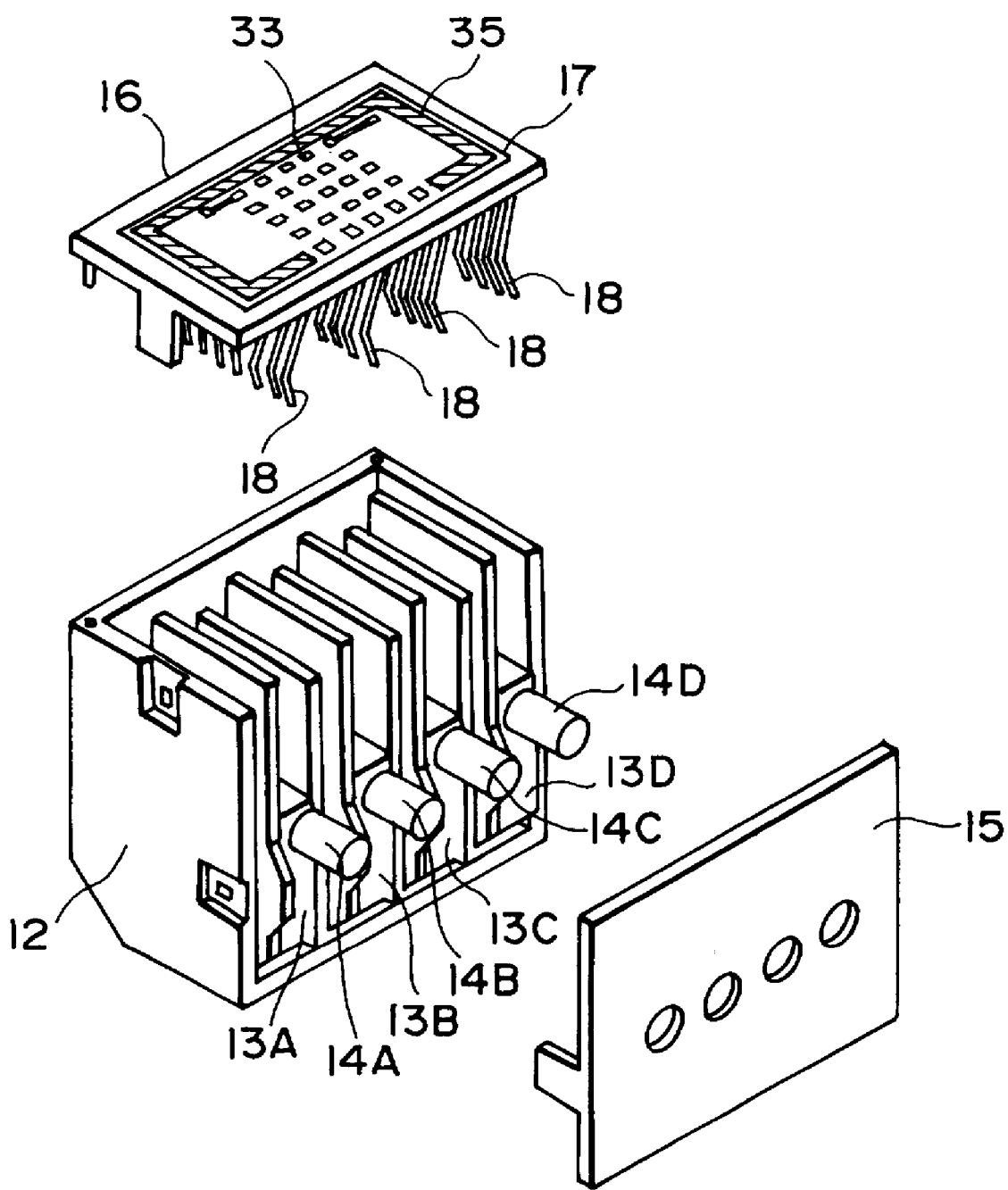
FIG. 6 is another exploded perspective view of the ink jet recording head of FIG. 4.

FIGS. 4, 5 and 6, are a perspective view of an ink jet recording head according to an embodiment of the present invention, an exploded perspective view and another exploded perspective view. As shown in these Figures, the ink jet recording head of this embodiment includes four recording heads 13a, 13b, 13c and 13d fixed in a unit frame 12. Each of the recording heads 13a–13d, is provided with ink ejection outlets not shown for ejecting the ink downwardly in the Figures, ink supply port 14a–14d, ejection energy generating elements for ejecting the ink, and wiring for supplying electric signals to the ejection energy generating elements. In this embodiment, the recording heads 13a–13d are effective to eject black, cyan, magenta and yellow inks. This is not limiting, and the four recording heads 13a–13d may eject the same color ink, in which case, the high speed recording or tone reproduction is possible. The tone reproduction may be enabled also by containing the same color but different density inks in the respective recording heads. To the unit frame 12 having the fixed recording heads 13a–13d, a side housing 15 and a top housing 16 are fixed. To the top housing 16, a print board (PCB) 17 is fixed. A PWB (wiring board) 7, is provided with a plurality of contact pads (electric connecting portions) 33 connectable with contact 18 on the backside of the top housing 16, a wiring pattern 23 and through hole 19 in the peripheral part of the PWB 7 except for a part adjacent the side housing 25, an electric discharge path 35 is formed, surrounding at least a part of the contact pad 33, the wiring pattern 32 and the through hole 19. The electric resistance of the discharge path 35 is lowered by plating copper, nickel or gold, similar to the contact pads 33, the wiring pattern 23 and the through hole 19.

Figure 7:
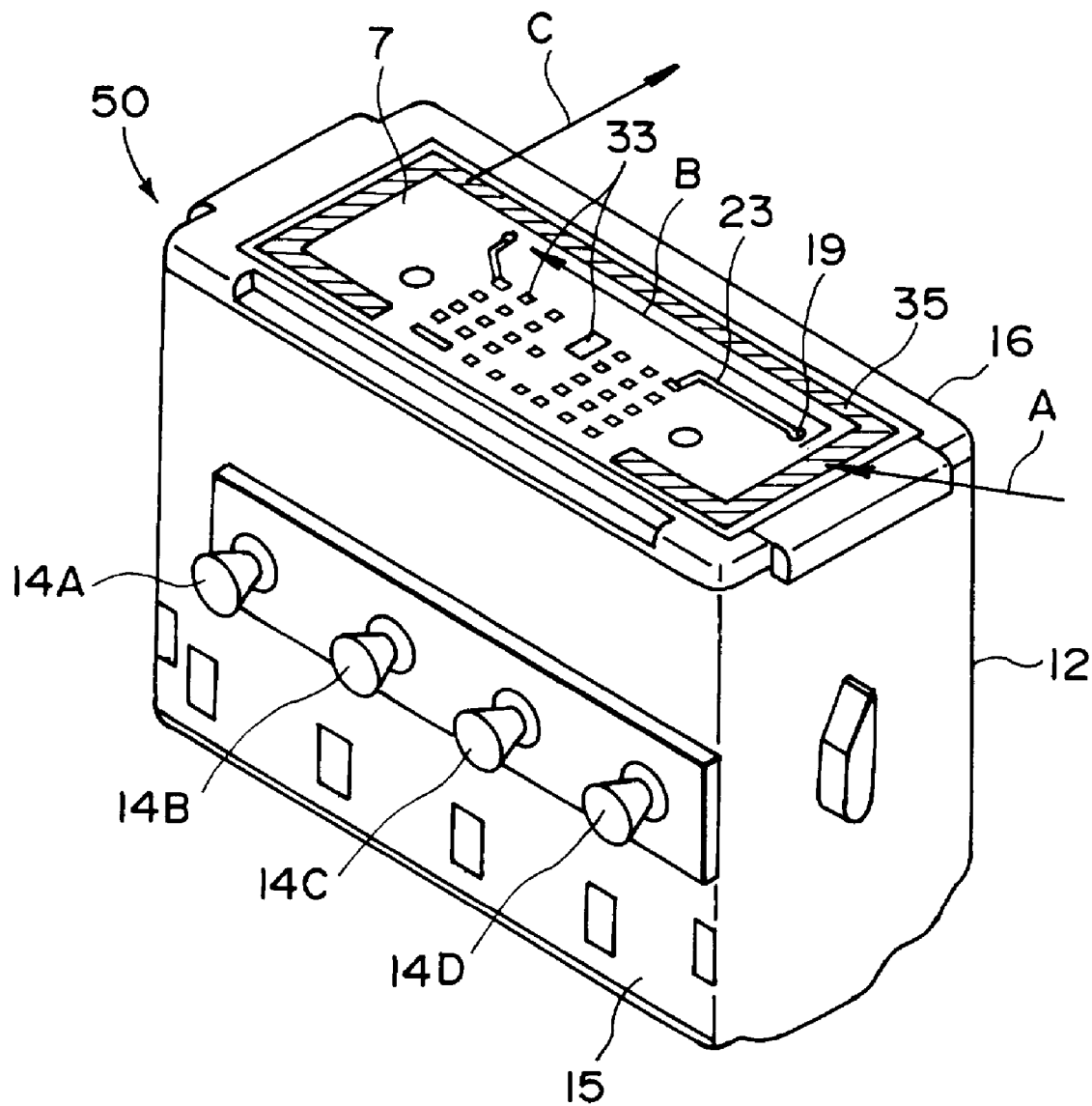
FIG. 7 is a perspective view of the ink jet recording head of FIG. 4 illustrating a discharge path.

Referring to FIG. 7, the function of the discharge path 35 of the ink jet recording head 50 having such a structure, will be described. For the purpose of comparison, the electric discharge in an ink jet recording head 111 of FIG. 8 without the discharge path, will also be described. The same reference numerals as in FIGS. 4–6, are assigned to the corresponding elements in FIG. 8.

Figure 8:
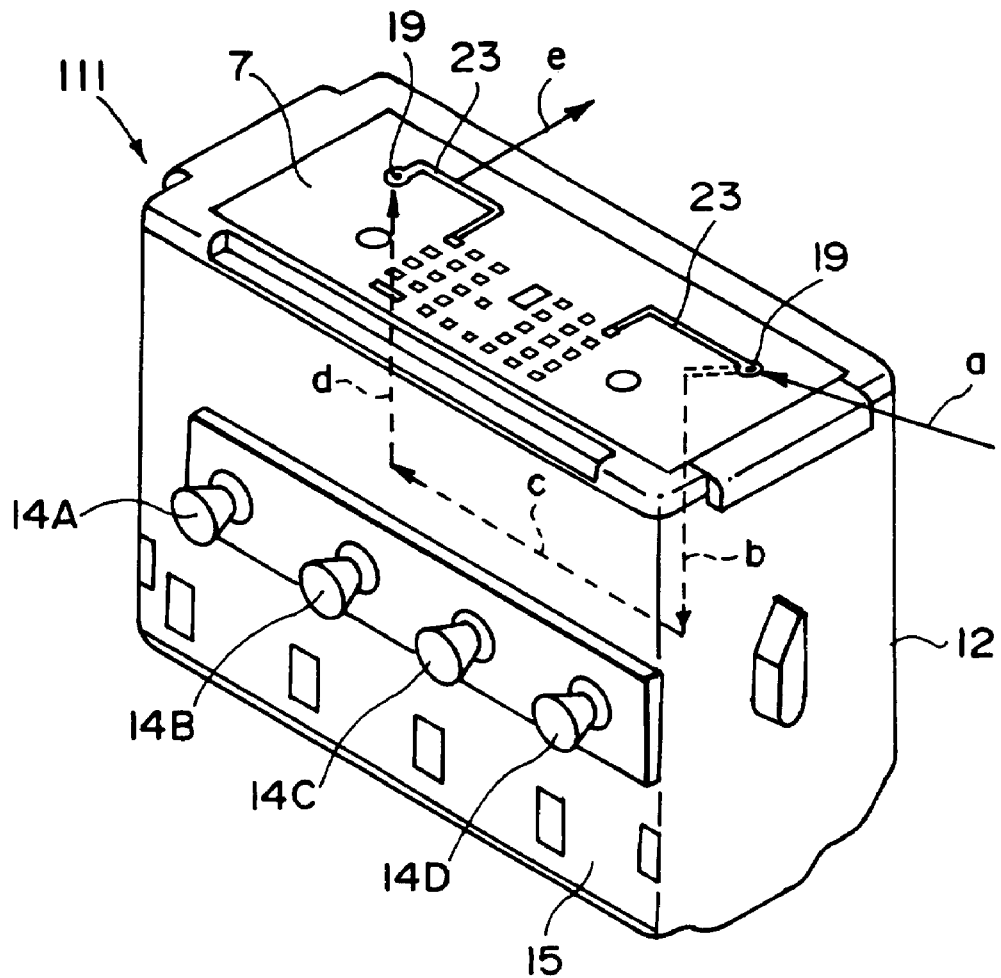
FIG. 8 is a perspective view of an ink jet recording head not using the present invention, illustrating the electric discharge path thereof.

In an ink jet recording head 50 shown in FIGS. 7 and 8, the PWB 7 has a recording head driving wiring because of the unification with an ink cartridge and because of color printing. When the static electricity is discharged to a neighborhood of a carriage for mounting a recording head of a recording apparatus when the ink jet recording head is mounted thereon, the electric discharge (a) occurs, in FIG. 8 not having the discharge path, from the carriage to the through hole 19 in the PWB 7, to the wiring pattern 23, the plated lead or the like. The electric discharge stored in the form of static electricity due to the discharge (a), flows into the ink jet recording head through the wiring. The electric discharge then is re-discharged (e) to the printing apparatus through the heater board of each of the recording head units (b, c, d) and the wiring pattern 23 or the like close to the electroconductive portion of the main assembly. When the electric charge stored as the static electricity is re-discharged through all of the recording head units, the voltage against which the heater board or the like in the recording head are durable is usually approx. 3 kV (discharge resistance of 400 ohm., and discharge capacitor of 200 pF). In other words, when the electric discharge and re-discharge occur through carriage, recording head, the inside of the recording head and the main assembly of the recording apparatus, the recording head will be damaged or destroyed. If an attempt is made to protect the recording head without use of the discharging path as in the conventional recording head, all the discharge and re-discharging points of the carriage and the recording apparatus have to be covered, and therefore, it is difficult to prevent the damage of the recording head through this method.

On the other hand, with the ink cartridge recording head according to this embodiment, the electric discharge path 35 is provided at the points where the electric discharge occurs from the carriage to the ink jet recording head, and the discharge path 35 is extended to a point where the re-discharge occurs to the recording apparatus. The discharge path has low resistance. Therefore, as shown in FIG. 7, even if the discharge (A) occurs from an unshown carriage to the recording head, the electric discharge stored in the form of static electricity does not flow through the inside of the recording head, and is re-discharged (B, C) to the main assembly of the recording apparatus through the discharge path 35. Using the ink jet recording head shown in FIG. 4, the electric discharge is imparted to each points of the carriage, and it has been found that no abnormality or damage of the recording head is observed with 25 KV (discharge resistance of 400 ohm, discharge capacitor of 200 pF).

In the ink jet recording head of this embodiment, the damage of the inside of the recording head is effectively prevented not only when the recording head is mounted on the recording apparatus but also when the re-discharge occurs to electroconductive portion from the recording head during transportation of the ink jet recording head. More particularly, the discharge path surrounds the contact pads, and the wiring pattern or the like to protect the contact pads and the wiring pattern connected to the inside of the recording head, and therefore even if the re-discharge occurs during the transportation or the like, the electric charge merely flows to the discharge path, and the inside of the recording head is not damaged.

Figure 9:
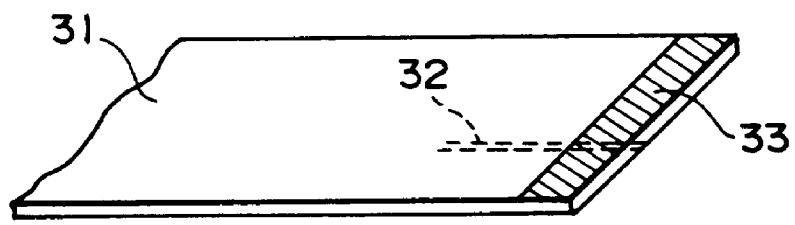
FIG. 9 is a perspective view of an example of an ink jet recording head in which wiring is exposed at an end.

Even if the cut surfaces of the plated lead 32 of the PCB 31 extends to an end of the board, as shown in FIG. 9, the discharge to the plated lead 32 can be prevented by provision of the discharge path 33 at an end of an opposite surface of the plated lead 32, and therefore, the damage of the recording head due to the discharge can be prevented.

FIG. 10 illustrates an ink jet recording head according to a further embodiment of the present invention. In this Figure, the same reference numerals as in FIG. 4 are assigned to the elements having the corresponding functions, and the detailed description thereof are omitted for simplicity. The ink jet recording head 50 of this embodiment is provided not only with the discharge path 35 at the peripheral portion of the PWB 7 but also with a discharge path 36 surrounding the respective contact pads 33. The discharge path 36 for the respective contact pads 33 is continuous, and is electrically connected to the peripheral discharge path 36.

In this embodiment, each of the contact pads 33 is surrounded by the discharging path 36, and therefore, the direct discharge to the contact pads 33 can be avoided. In addition, the discharge path 36 is connected with the re-discharging point of the recording apparatus through the discharge path 35, and therefore, the electric charge does not flow into the inside of the recording head, and the damage of the recording head can be avoided.

Figure 1:
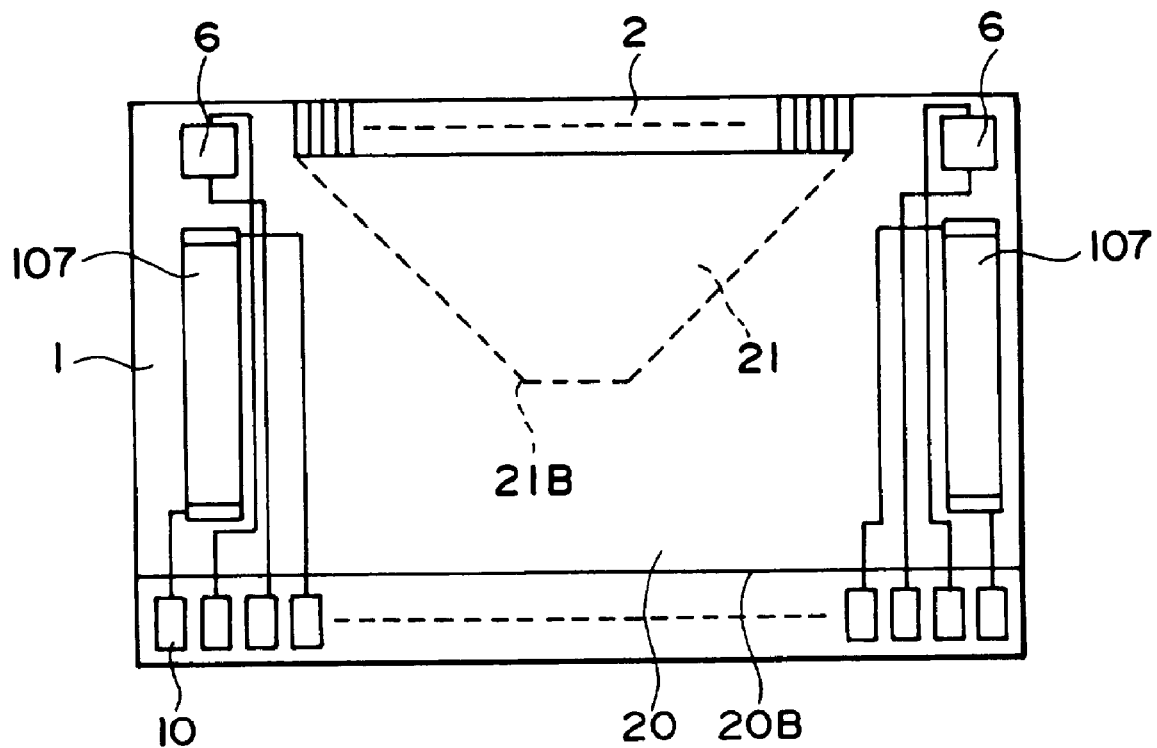
FIG. 1 is a top plan view of an example of an element substrate.
Figure 2:
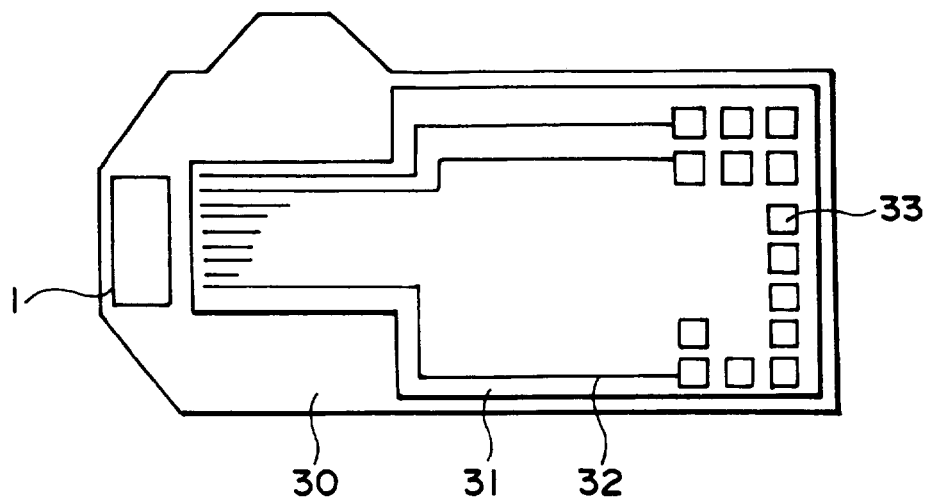
FIG. 2 illustrates an example of a recording head.
Figure 3:
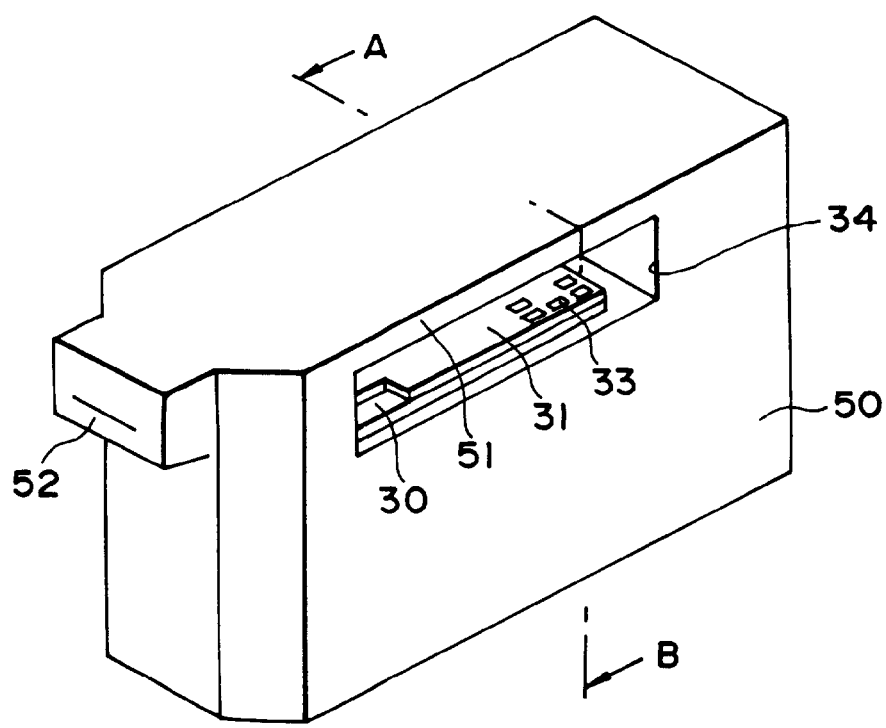
FIG. 3 is a perspective view of an example of a recording head.

In the foregoing embodiments, the discharge path for releasing the static electricity is provided at the peripheral portion of the electric contact parts of the recording head. The following embodiment is related to the recording head having the protection plate as shown in FIG. 3.

FIG. 11 is a sectional view of an ink jet recording head according to this embodiment. In the space of the recess 34, a metal support (aluminum base plate, in this embodiment) 30 is disposed. On the base plate, PCB (wiring board) 31 is mounted, and on the PCB 31, pads 33 are provided for external electric connection. In the conventional structure, a depth (lateral direction in the Figure) of the space was substantially the same as that of the PCB 31. In this example, an end of the aluminum base plate adjacent the opening is extended beyond the edge of the opening 34 outwardly. On the other hand, the positions of the pads 33 are the same in a conventional example. When a charged substance, for example, a users finger, approaches to the opening 34, the electric discharge first occurs to the edge 37 of the aluminum base plate 30 in this embodiment. Even if the finger further enters toward the pads 33, no discharge occurs to the pads 33 because the electric discharge has already occurred to the base plate 30. Therefore, the electric discharge to the pad due to the electrostatic discharge can be prevented, and therefore, the damage to the recording head can be effectively prevented.

FIG. 12 shows another embodiment. In the embodiment of FIG. 11, the base plate is extended to promote the discharge there. In this embodiment, a metal member 38 is provided at the opening 34 edge to promote the discharge. The metal member 38 may be of aluminum or another metal.

The present invention is not limited to the detailed structure described above, but covers the structure by which when the ink jet recording head is subjected to the electric discharge from the outside such as the carriage or the like, the electric discharge is positively received, and the re-discharge is positively effected to the main assembly of the recording apparatus without damaging the function of the recording head, by the provision of the discharging path.

The position of the discharging path is preferably such that it is not contacted by the users finger upon the mounting or demounting of the recording head or such that the electric discharge occurs by the contact with the ink container or the main assembly upon the mounting of the recording head to the main assembly. Furthermore, it is desirable that the discharge path surrounds the contact pads, wiring or the contact hole.

Figure 13:
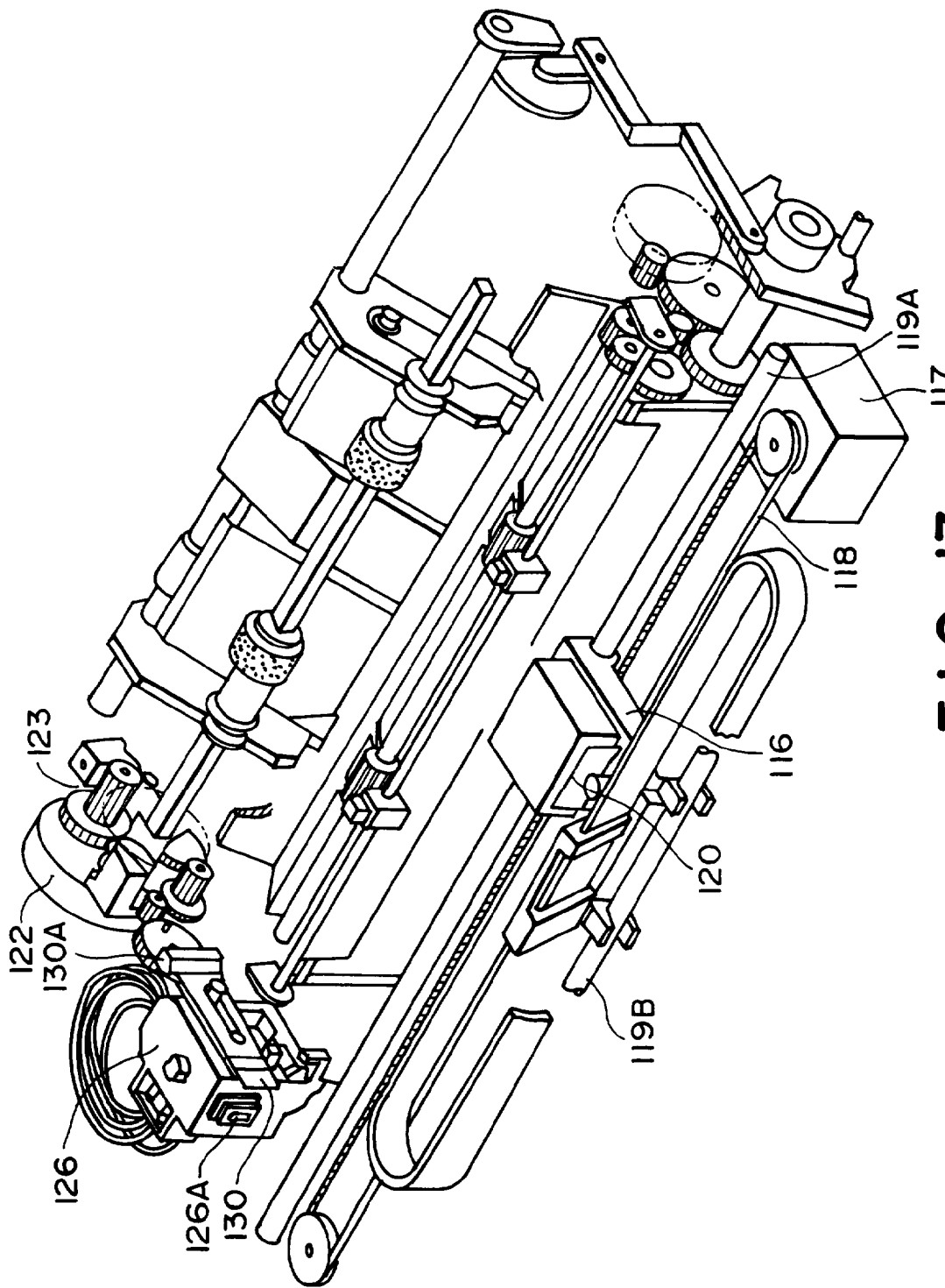
FIG. 13 is a perspective view of a recording apparatus loaded with an ink jet head according to an embodiment of the present invention.

Referring to FIG. 13, there is shown an example of an ink jet recording apparatus (IJRA) to which an ink jet head cartridge (IJC) which is a recording head according to an embodiment of the present invention, is mounted.

In this Figure, designated by 120 is an ink jet head cartridge (IJC) having nozzles for ejecting ink onto a recording surface of a recording material having been fed to a platen which constitutes feeding means for feeding the recording material (a sheet of paper in this example). The IJC 120 is mounted on a head carriage (HC) 116, which is coupled with a driving belt 118 for transmitting driving force from a driving motor 117 and which is slidably supported on two parallel guiding shafts 119a and 119b to reciprocate the IJC 120 over the entire width of the recording material.

Designated by 126 is a recovery device, and is disposed at one end of the reciprocating path of the IJC 120, for example, at a position opposed to the home position of the IJC 120. The recovery device is driven by the motor 122 through a transmission mechanism 123. It caps an ejection side of the IJC with a cap 126A, and the ink is forced to discharge through the ejection outlets by ink suction by sucking means in the recovery device or by pressure means in an ink supply path of the IJC 120. By doing so, the viscosity increased ink or the like in the nozzles is discharged, thus refreshing the nozzles. In addition, the capping is effected upon the end of the recording operation to protect the IJC 120.

Designated by 130 is a cleaning blade which is disposed at a side of the recovery device 126 and which functions to wipe the ejection side surface of the IJC 120. The blade is of silicone rubber. The blade 130 is supported by a support 130A in the form of a cantilever. Similarly to the recovery device, it is driven by the motor 122 through the transmission mechanism 123 to be brought into contact to the ejection side surface of the IJC 120 the blade is moved into the reciprocation path of the IJC 120 at proper timing during the recording operation of the IJC 120 or after ejection recovery operation of the recovery device, by which the dew condensation, wetting and foreign matter are wiped out of the ejection side surface of the IJC 120 with the movement of the IJC 120.

The recording apparatus comprises means for supplying the driving signal for driving the ink jet head cartridge thereto.

The present invention is particularly suitably usable in an ink jet recording head and recording apparatus wherein thermal energy by an electrothermal transducer, laser beam or the like is used to cause a change of state of the ink to eject or discharge the ink. This is because the high density of the picture elements and the high resolution of the recording are possible.

The typical structure and the operational principle are preferably the ones disclosed in U.S. Pat. Nos. 4,723,129 and 4,740,796. The principle and structure are applicable to a so-called on-demand type recording system and a continuous type recording system. Particularly, however, it is suitable for the on-demand type because the principle is such that at least one driving signal is applied to an electrothermal transducer disposed on a liquid (ink) retaining sheet or liquid passage, the driving signal being enough to provide such a quick temperature rise beyond a departure from nucleation boiling point, by which the thermal energy is provided by the electrothermal transducer to produce film boiling on the heating portion of the recording head, whereby a bubble can be formed in the liquid (ink) corresponding to each of the driving signals. By the production, development and contraction of the the bubble, the liquid (ink) is ejected through an ejection outlet to produce at least one droplet. The driving signal is preferably in the form of a pulse, because the development and contraction of the bubble can be effected instantaneously, and therefore, the liquid (ink) is ejected with quick response. The driving signal in the form of the pulse is preferably such as disclosed in U.S. Pat. Nos. 4,463,359 and 4,345,262. In addition, the temperature increasing rate of the heating surface is preferably such as disclosed in U.S. Pat. No. 4,313,124.

The structure of the recording head may be as shown in U.S. Pat. Nos. 4,558,333 and 4,459,600 wherein the heating portion is disposed at a bent portion, as well as the structure of the combination of the ejection outlet, liquid passage and the electrothermal transducer as disclosed in the above-mentioned patents. In addition, the present invention is applicable to the structure disclosed in Japanese Laid-Open Patent Application No. 123670/1984 wherein a common slit is used as the ejection outlet for plural electrothermal transducers, and to the structure disclosed in Japanese Laid-Open Patent Application No. 138461/1984 wherein an opening for absorbing pressure wave of the thermal energy is formed corresponding to the ejecting portion. This is because the present invention is effective to perform the recording operation with certainty and at high efficiency irrespective of the type of the recording head.

The present invention is applicable to a serial type recording head wherein the recording head is fixed on the main assembly, to a replaceable chip type recording head which is connected electrically with the main apparatus and can be supplied with the ink when it is mounted in the main assembly, or to a cartridge type recording head having an integral ink container.

The provisions of the recovery means and/or the auxiliary means for the preliminary operation are preferable, because they can further stabilize the effects of the present invention. As for such means, there are capping means for the recording head, cleaning means therefor, pressing or sucking means, preliminary heating means which may be the electrothermal transducer, an additional heating element or a combination thereof. Also, means for effecting preliminary ejection (not for the recording operation) can stabilize the recording operation.

As regards the variation of the recording head mountable, it may be a single corresponding to a single color ink, or may be plural corresponding to the plurality of ink materials having different recording color or density. The present invention is effectively applicable to an apparatus having at least one of a monochromatic mode mainly with black, a multi-color mode with different color ink materials and/or a full-color mode using the mixture of the colors, which may be an integrally formed recording unit or a combination of plural recording heads.

Furthermore, in the foregoing embodiment, the ink has been liquid. It may be, however, an ink material which is solidified below the room temperature but liquefied at the room temperature. Since the ink is controlled within the temperature not lower than 30° C. and not higher than 70° C. to stabilize the viscosity of the ink to provide the stabilized ejection in usual recording apparatus of this type, the ink may be such that it is liquid within the temperature range when the recording signal is the present invention is applicable to other types of ink. In one of them, the temperature rise due to the thermal energy is positively prevented by consuming it for the state change of the ink from the solid state to the liquid state. Another ink material is solidified when it is left, to prevent the evaporation of the ink. In either of the cases, the application of the recording signal producing thermal energy, the ink is liquefied, and the liquefied ink may be ejected. Another ink material may start to be solidified at the time when it reaches the recording material. The present invention is also applicable to such an ink material as is liquefied by the application of the thermal energy.

The ink jet recording apparatus may be used as an output terminal of an information processing apparatus such as computer or the like, as a copying apparatus combined with an image reader or the like, or as a facsimile machine having information sending and receiving functions.

As described in the foregoing, there is provided a discharging path or line at least partly around the electric contacts and wiring. Therefore, even if the discharge occurs from the carriage or another outside substance or even if the re-discharge occurs from the recording head to the main assembly, the discharging and re-discharging occur through the discharge path. This prevents flow of the current inside the recording head, thus protecting the function of the head. The discharge path can be easily formed together with formation of the contact pads on the print board, at low cost. Thus, the damage due to the static electricity can be easily and inexpensively avoided.

In another aspect of the present invention, a metal part is provided at an edge of an opening continuing the space accommodating a metal base plate mounting thereon a heater board or PCB, by which the electric discharge from a charged substance is received by the metal, thus preventing the discharge to the contact pads on the PCB, and therefore, preventing the damage of the heater board.

While the invention has been described with reference to the structures disclosed herein, it is not confined to the details set forth and this application is intended to cover such modifications or changes as may come within the purposes of the improvements or the scope of the following claims.

What is claimed is:

1. An ink jet recording head detachably mountable to a main assembly of a recording apparatus, comprising:

ejection energy generating elements for generating energy for ejecting an ink;

wiring for supplying electric signals to said ejection energy generating elements;

electric contacts provided on a surface, connected with said wiring, for receiving the electric signals from said recording apparatus; and an electric discharge path, provided at a marginal area of the surface on which said electric contacts are provided and provided for at least a part of a periphery of said electric contacts, for releasing static electricity from the ink jet recording head directly to the recording apparatus without introducing an electric charge to said wiring.

2. An ink jet recording head according to claim 1, wherein said discharge path surrounds the respective electric contacts.

3. An ink jet recording head according to claim 1, wherein said discharge path and said electric contacts are simultaneously formed on a wiring board.

4. An ink jet recording head detachably mountable to a main assembly of a recording apparatus, comprising:

an element board having ejection energy generating elements for generating energy for ink ejection, and wiring for supplying electric signals to said ejection energy generating elements;

a wiring board having electric contacts for receiving the electric signals from said recording apparatus and wiring for electrically connecting said electric contacts and said element board;

a metal support for supporting said element board and said wiring board;

a body having an opening leading to a cavity, wherein said electric contacts are disposed in said cavity; and a discharge path, provided adjacent to an edge of said opening, for releasing static electricity.

5. An ink jet recording head according to claim 4, wherein said discharge path is constituted by a metal embedded at the edge.

6. An ink jet recording head according to claim 1 or 4, wherein said ejection energy generating elements are electrothermal transducers.

7. An ink jet recording apparatus, comprising:

an ink jet recording head detachably mountable to a main assembly of the ink jet recording apparatus, comprising;

ejection energy generating elements for generating energy for ejecting an ink, wiring for supplying electric signals to said ejection energy generating elements, electric contacts provided on a surface, connected with said wiring, for receiving the electric signals from said recording apparatus, and an electric discharge path, provided at a marginal area of the surface on which said electric contacts are provided and provided for at least a part of a periphery of said electric contacts, for releasing static electricity from the ink jet recording head directly to the recording apparatus without introducing an electric charge to said wiring; and feeding means for feeding a recording material for receiving the ink ejected from said recording head.

8. An ink jet recording apparatus, comprising:

an ink jet recording head detachably mountable onto a main assembly of the ink jet recording apparatus, comprising;

an element board having ejection energy generating elements for generating energy for ink ejection, and wiring for supplying electric signals to said ejection energy generating elements, a wiring board having electric contacts for receiving the electric signals from said recording apparatus and wiring for electrically connecting said electric contacts and said element board, a metal support for supporting said element board and said wiring board, a body having an opening leading to a cavity, wherein said electric contacts are disposed in said cavity, and a discharge path, provided adjacent to an edge of said opening, for releasing static electricity; and driving signal supplying means for driving said recording head.

* * * * *

UNITED STATES PATENT AND TRADEMARK OFFICE
CERTIFICATE OF CORRECTION

PATENT NO. : 6,074,041

DATED : June 13, 2000

INVENTOR(S) : YOSHIYUKI IMANAKA, ET AL

It is certified that error appears in the above-identified patent and that said Letters Patent is hereby corrected as shown below:

ON THE TITLE PAGE:

Insert: --[*] Notice:   This patent issued on a continued prosecution application filed under 37 CFR 1.53(d), and is subject to the twenty year patent term provisions of 35 U.S.C. 154(a)(2).--; and

[56] References Cited, under FOREIGN PATENT DOCUMENTS

"4247947" should read --4-247947--.

COLUMN 3:

Line 66, "a perspective view" should read --perspective views--.

COLUMN 4:

Line 5, "not shown" should read --(not shown)--; and
    Line 6, "port" should read --ports.--.

COLUMN 6:

Line 8, "users" should read --user's--; and
            "to the" should read --the--.

COLUMN 8:

Line 33, "is" (first occurrence) should read --of--.

UNITED STATES PATENT AND TRADEMARK OFFICE
CERTIFICATE OF CORRECTION

PATENT NO.    : 6,074,041
DATED         : June 13, 2000
INVENTOR(S)   : YOSHIYUKI IMANAKA, ET AL It is certified that error appears in the above-identified patent and that said Letters Patent is hereby corrected as shown below:

<u>COLUMN 10</u>:

Line 10, "ing;" should read --ing:--; and
Line 30, "comprising;" should read --comprising:--.

Signed and Sealed this

Eighth Day of May, 2001

*Attest:*

NICHOLAS P. GODICI

*Attesting Officer*   Acting Director of the United States Patent and Trademark Office